(12) United States Patent
Saito

(10) Patent No.: US 6,469,340 B2
(45) Date of Patent: Oct. 22, 2002

(54) FLASH MEMORY DEVICE WITH AN INVERTED TAPERED FLOATING GATE

(75) Inventor: Kenji Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/863,705

(22) Filed: May 23, 2001

(65) Prior Publication Data

US 2001/0048129 A1 Dec. 6, 2001

(30) Foreign Application Priority Data

May 23, 2000 (JP) ........................................ 2000-151694

(51) Int. Cl.⁷ ............................................. H01L 29/788
(52) U.S. Cl. ....................................... 257/315; 257/317
(58) Field of Search ................................ 257/315, 316, 257/317

(56) References Cited

U.S. PATENT DOCUMENTS

| | | | | |
|---|---|---|---|---|
| 5,767,005 A | * | 6/1998 | Doan et al. | 438/593 |
| 5,963,806 A | * | 10/1999 | Sung et al. | 438/266 |
| 5,973,353 A | * | 10/1999 | Yang et al. | 257/315 |
| 6,054,733 A | * | 4/2000 | Doan et al. | 257/315 |

FOREIGN PATENT DOCUMENTS

| | | |
|---|---|---|
| JP | 1-291470 | 11/1989 |
| JP | 3-198377 | 8/1991 |
| JP | 7-22195 | 3/1995 |
| JP | 2-780715 | 5/1998 |

* cited by examiner

Primary Examiner—Michael S. Lebentritt
Assistant Examiner—Bradley Smith

(57) ABSTRACT

In a semiconductor memory device such as a flash memory, a field oxide film is formed to a forward taper shape on a semiconductor substrate, and a floating gate is formed to a reverse (inverted) taper shape between the field oxide film over the semiconductor substrate.

7 Claims, 4 Drawing Sheets

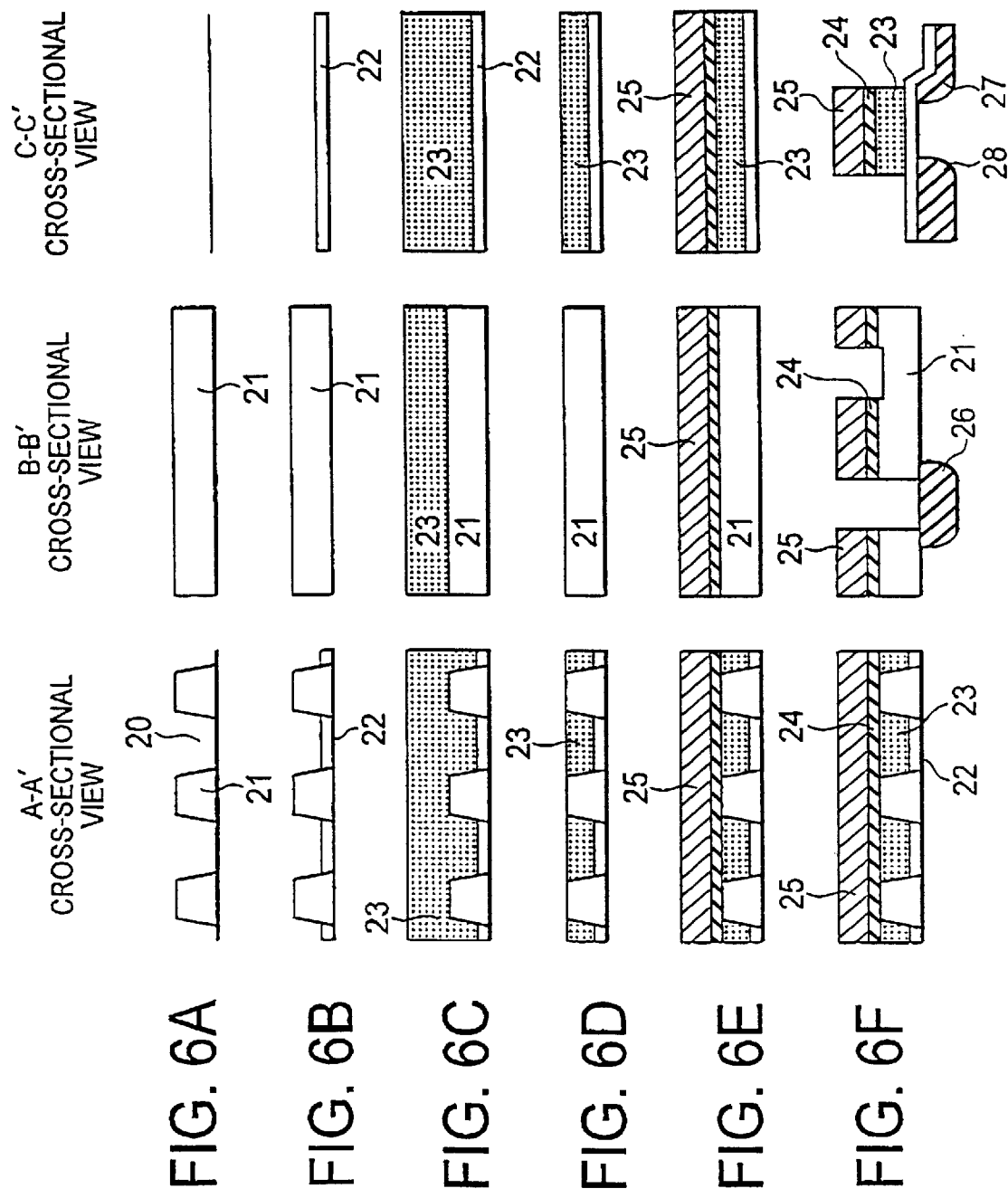

FLASH MEMORY DEVICE WITH AN INVERTED TAPERED FLOATING GATE

BACKGROUND OF THE INVENTION

This invention broadly relates to a semiconductor memory device and a method of manufacturing the same.

More specifically, this invention is directed to a nonvolatile semiconductor, device, such as, a flash memory.

In such a nonvolatile semiconductor device, it is becoming increasingly important to miniaturize a memory cell so as to reduce a production cost therefor.

To this end, the memory cell is generally reduced in size by reducing a design rule. However, if the design rule is simply reduced in dimension, it is also required to be reduced the dimension in a mask alignment during a production process.

Under this circumstance, the accuracy of the mask alignment (misalignment) is determined mechanically, and as a result, can not follow the speed with respect to the reduction (namely, a fine process) of the design rule. This fact prevents the miniaturization of the memory cell so as to avoid the reduction of the semiconductor memory device.

Referring to FIGS. 1 and 2, description will be hereinafter made about a related nonvolatile semiconductor memory device.

A field oxide film (device isolation region) 51 extended in a predetermined direction is deposited by the use of the known LOCOS (Local Oxidation of Silicon) method. Further, a channel region (a diffusion layer region) 52 is formed between the field oxide film 51. Thereafter, a tunnel oxide film 53 is deposited on the channel region 52.

Subsequently, a polysilicon layer containing phosphorus is formed. Thereafter, the polysilicon layer is selectively removed so as to cover at least channel region 52. Thereby, the polysilicon layer is left or, remained in such a direction that the channel region 52 is extended. Thus, a floating gate 54 is formed.

After an insulating film 55 is deposited on the surface thereof, a multi-layer of WSi and polysilicon is deposited thereon. The WSi/polysilicon film is selectively removed, and serves as a plurality of word lines 56 extended in a direction which perpendicularly crosses for the channel region 52.

The insulating film 55 and the floating gate 54 are removed in a self-alignment manner with the word line 56 to form a memory cell transistor.

Next, ion implantation is carried out to form a source region 61 and a drain region 62. After an interlayer insulating film 63 is deposited, a contact 64 and a metal wiring pattern 65 are formed finally.

However, the floating gate 54 is not formed in the self-alignment manner for the channel region 52 in the related art. In consequence, when the mask displacement (misalignment) occurs for the channel region 52, a current leak (a channel leak pass) generates in the memory cell, as illustrated in FIG. 3B.

To avoid such a current leak, the memory cell has been previously designed taking the alignment deviation for the channel region 52 into consideration. Consequently, the floating gate 54 must be normally aligned for the field oxide film 51, as illustrated in FIG. 3A. As a result, the sell size is inevitably increased.

Further, the floating gate 54 are placed on the edge of the field oxide film 51 formed by the LOCOS via the tunnel oxide film 53. Thereby, the tunnel oxide film 53 is destroyed or degraded during a high-voltage writing operation or an erasing operation peculiar to the flash memory.

Thus, the floating gate 54 and the channel region 52 are not formed in the self-alignment manner in the above-mentioned related art. This fact prevents the reduction of the memory cell in comparison with the other semiconductor memory devices.

SUMMARY OF THE INVENTION

It is therefore an object of this invention to provide a semiconductors memory device which is capable of designing a fine memory cell without a mask displacement (misalignment) for a field oxide film.

According to this invention, a semiconductor memory device has a semiconductor substrate.

A field oxide film is formed to a forward taper shape on the semiconductor; substrate. Further, a floating gate is formed to a reverse (inverted) taper shape between the field oxide film over the semiconductor substrate.

Herein, the forward taper shape means that side wall angle is less than 90 degrees while the reverse taper shape means that sidewall angle is more than 90 degrees.

In this event, a tunnel oxide film is preferably formed between the floating gate and the semiconductor substrate.

The semiconductor substrate may comprise a p-type silicon substrate.

The field oxide film desirably has a thickness within a range between 300 nm and 500 nm.

The tunnel oxide film preferably has a thickness within a range between 8 nm and 10 nm.

Further, a word line may be formed via an insulating film on the floating gate.

For example, the semiconductor memory device is a flash memory.

More specifically, the field oxide film is deposited on the silicon substrate, and a plurality of grooves are formed so as to extend in a predetermined direction and to reach the semiconductor substrate.

Further, the side surface of the groove is formed to a forward taper shape, and the polysilicon serving as the floating gate is buried in the groove.

As mentioned above, the polysilicon serving as the floating gate is conventionally processed in accordance with the pattern of the field oxide film using the mask alignment.

In contrast, the field oxide film is deposited to the forward taper shape in this invention. Thereby, the polysilicon, which will serve as the floating gate buried between the field oxide film, is buried in the groove which has been formed in advance.

In consequence, the floating gate is formed in the self-alignment manner with the pattern of the field oxide film.

Moreover, when the floating gate is etched in the self-alignment manner during processing the word line, the etching is readily carried out without generating residue. Further, capacitance ratio as an importance device parameter of the flash memory is enhanced effectively.

Accordingly, the fine memory cell of the nonvolatile semiconductor memory device having high yield and high performance can be obtained.

Further, according to this invention, the floating gate is formed between the field oxide films processed to the forward taper shape. Thereby, the polysilicon is not readily left at the sidewall of the. groove when the floating gate is etched.

Further, the floating gate has the reverse (inverted) taper structure, and thereby, has high capacitance ratio (Cox/Ctox, Ctox: tunnel oxide film capacitance, Cox: insulating (ONO) capacitance). Consequently, the flash memory is advantageous for the reading characteristic.

Moreover, the floating gate is formed in the self-alignment manner with the field oxide film. In consequence, it is unnecessary to take the mask displacement (misalignment) for the filed oxide film into account. As a result, the fine memory design becomes possible.

In addition, the floating gate does not include the LOCOS edge in comparison with the flash memory cell formed by the conventional device isolation method due to the LOCOS. Consequently, the tunnel oxide film is not readily degraded or destroyed by applying the high voltage.

BRIEF DESCRIPTION OF THE DRAWINGS

FIGS. 6A through 6F are flow diagrams showing steps for manufacturing a semiconductor memory device according to this invention.

DESCRIPTION OF PREFERRED EMBODIMENTS

Figure 1:
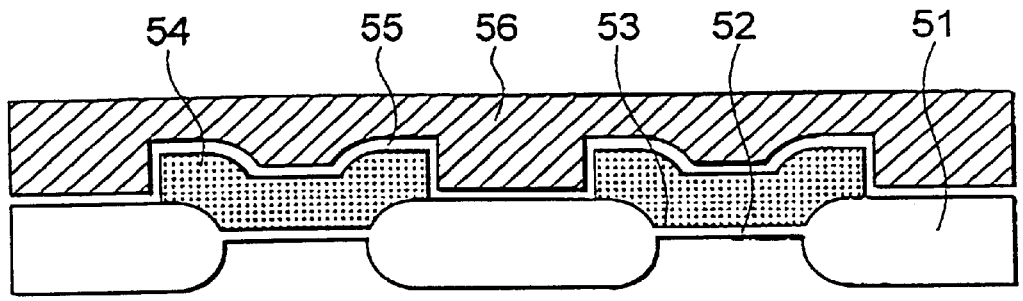
FIG. 1 is a cross sectional view showing a related semiconductor memory device.
Figure 2:
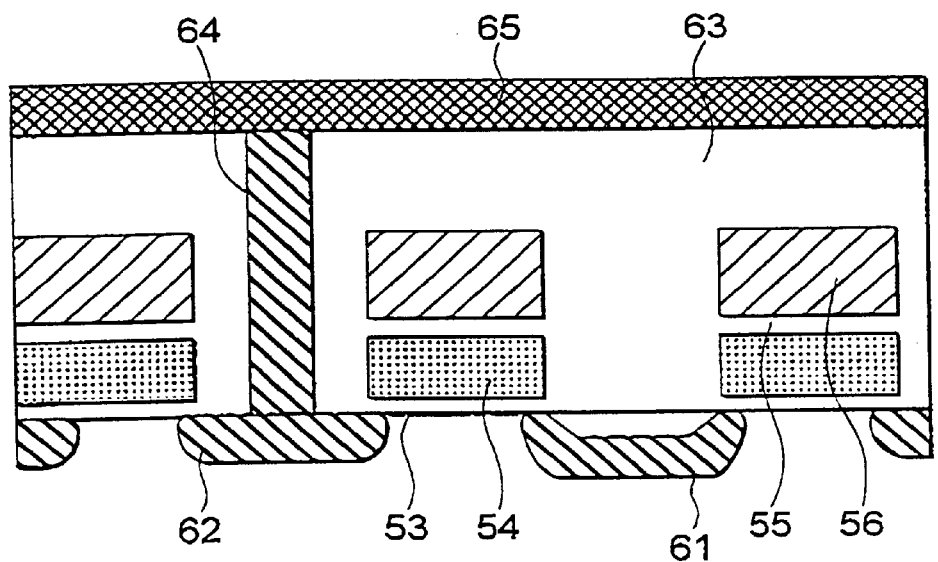
FIG. 2 is another cross sectional view showing the related semiconductor memory device.
Figures 3A, 3B:
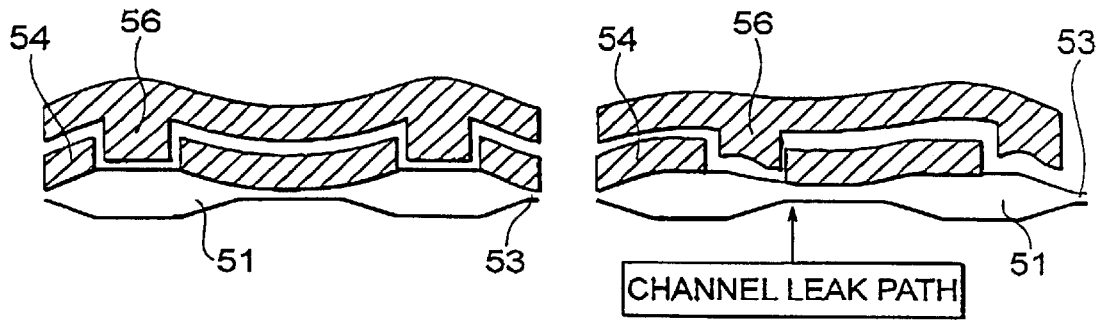
FIGS. 3A and 3B are cross sectional views explaining problems of the related art.
Figure 4:
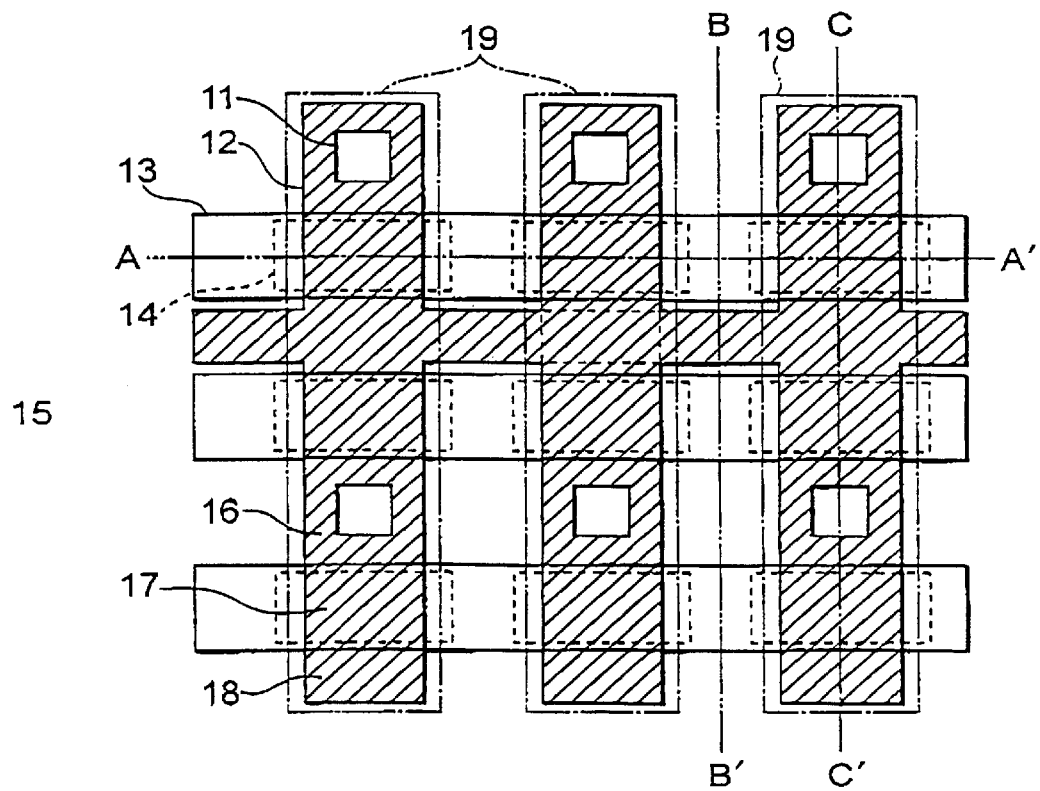
FIG. 4 is a plan view of a cell array of a semiconductor memory device according to this invention.

Referring to FIG. 4, description will be hereinafter made about an embodiment of this invention.

In FIG. 4, an array having six cells of a nonvolatile semiconductors, device (for example, a flash memory) is illustrated. In this event, the reference numeral 11 represents a drain contact, the reference numeral 12 represents a diffusion layer, the reference numeral 13 represents a word line, the reference numeral 14 rep resents a floating gate, the reference numeral 15 represents a source wiring line, and the reference numeral 16 represent a memory cell drain.

Further, the reference numeral 17 indicates a memory cell channel, the reference numeral 18 indicates a memory cell source, and the reference numeral 19 indicates a bit line.

Figure 5A:
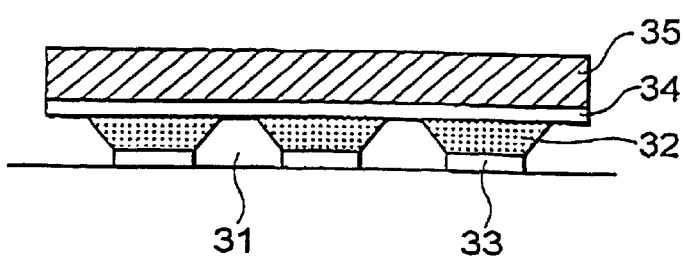
FIGS. 5A and 5B are diagrams showing a structure of a semiconductors memory device according to this invention.
Figure 5B:
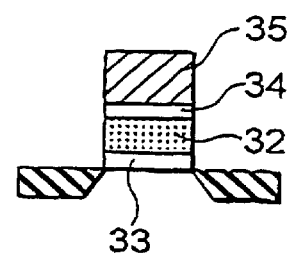

Referring to FIGS. 5A and 5B, description will be made about the structure of the semiconductor memory device.

A field oxide film 31 is deposited to a forward taper shape on a semiconductor substrate. In this case, the semiconductor substrate may be a p-type silicon substrate.

Further, a floating gate 32 is formed to a reverse (inverted) taper shape between the field oxide film 31 of the forward taper shape on the semiconductor substrate.

Herein the forward taper shape means that sidewall angle is less than 90 degrees while the reverse taper shape means that sidewall angle is more than 90 degrees.

Moreover, a tunnel oxide film 33 is placed between the floating gate 32 and the semiconductor substrate. On the floating gate 32, the word line 35 is formed via an insulating film (ONO) 34.

Subsequently, description will be made about a method for manufacturing the semiconductor memory device according to this invention with reference to FIGS. 6A through 6F.

First, an oxide film, which will serve as a field oxide film, is deposited to a thickness of about 300 nm to 500 nm on a p-type semiconductor substrate.

Thereafter, a plurality of grooves 20 are formed to a forward taper shape so as to extend in the predetermined direction. Thereby, a filed oxide film 21 is formed in the forward taper shape, as illustrated in FIG. 6A.

In this case, the forward taper shape is formed by the use of taper etching when anisotropic etching is carried out.

Alternatively, after the etching may be performed vertically, an oxide film may be deposited again, and a sidewall may be formed to a taper shape by etching with the film thickness of the oxide film.

Instead, use may be made about the other method for forming the forward taper.

Subsequently, a tunnel oxide film 22 is deposited to the film thickness of about 8 nm to 10 nm on the exposed surface of the silicon substrate by the use of a thermal oxidation method, as illustrated in FIG. 6B.

Next, polysilicon containing phosphorous impurity, which will serve as a floating gate 23, is buried in the groove 20 between the field oxide film 22 by the use of the known CVD (Chemical Vapor Deposition) method, as illustrated in FIG. 6C. In this event, the height of the buried polysilicon is higher than that of the field oxide film 22.

Thereafter, the polysilicon is removed with the predetermined film thickness by using CMP (Chemical Mechanical Polishing). Consequently, the polysilicon is left or remained in only the grooves 20 between the field oxide films 21, as illustrated in FIG. 6D.

Successively, an insulating film 24 is deposited on the entire surface. Recently, use is generally made of a silicon oxide film, a silicon nitride film, an ONO film formed by laminating a silicon oxide film ,as the insulating film 24.

After the insulating film 24 is deposited to the film thickness of approximately 15 nm, a multilayer of WSi/polysilicon, which will be serves as a word line 25, is deposited on the entire surface, as illustrated in FIG. 6E.

Subsequently, the multilayer of the WSi/polysilicon is selectively left so as to extend in a direction perpendicular to the groove 20 to form a word line 25.

Thereafter, the insulating film (ONO) and the polysilicon containing phosphorus are removed in a self-alignment manner with the word line 25. Thereby, the floating gate 23 is formed.

Next, the field oxide film 21 between the word lines 25 is removed alternately. Herein, it is to be noted that the word line 25 will serve as; a source-wiring pattern.

Thereafter, a source region 27 and a drain region 28 are formed by implanting arsenic ions, as illustrated in FIG. 6F.

Subsequently, an interlayer insulating film, a contact, a metal wiring pattern (not shown) are formed thereon, and thereby, the formation of the memory cell is completed. Herein, the dry-etching may be carried out in lieu of the CMP method performed in the step illustrated in FIG. 6D.

While the invention has thus far been disclosed in conjunction with several embodiments thereof, it will be readily possible for those skilled in the art to put this invention into practice in various other manners.

What is claimed is:

1. A semiconductor memory device having a semiconductor substrate, comprising:

a field oxide film which is formed to a single forward taper shape on the semiconductor substrate, and a floating gate which is formed to a reverse taper shape between the field oxide film over the semiconductor substrate, wherein a first sidewall angle is less than 90 degrees in the forward taper shape while a second sidewall angle is more than 90 degrees in the reverse taper shape, said first sidewall angle and said second sidewall angle being measured with respect to a plane at which said field oxide film and said semiconductor substrate meet.

2. A device as claimed in claim 1, wherein:

a tunnel oxide film is formed between the floating gate and the semiconductor substrate.

3. A device as claimed in claim 1, wherein:

the semiconductor substrate comprises a p-type silicon substrate.

4. A device as claimed in claim 1, wherein:

the field oxide film has a thickness within a range between 300 nm and 500 nm.

5. A device as claimed in claim 1, wherein:

the tunnel oxide film has a thickness within a range between 8 nm and 10 nm.

6. A device as claimed in claim 1, wherein:

a word line is formed via an insulating film on the floating gate.

7. A device as claimed in claim 1, wherein:

the semiconductor memory device comprises a flash memory.

* * * * *